United States Patent

Mihara

[11] Patent Number: 6,020,111
[45] Date of Patent: Feb. 1, 2000

[54] METHOD OF MANUFACTURING SEMICONDUCTOR DEVICE WITH PATTERNED LAMINATION OF SI FILM AND METAL FILM

[75] Inventor: Satoru Mihara, Kawasaki, Japan

[73] Assignee: Fujitsu Limited, Kawasaki, Japan

[21] Appl. No.: 09/037,854

[22] Filed: Mar. 10, 1998

[30] Foreign Application Priority Data

Aug. 11, 1997 [JP] Japan .................................. 9-216765

[51] Int. Cl.⁷ .................................................. H01L 21/00
[52] U.S. Cl. ...................... 430/318; 430/313; 430/316; 430/330; 438/714; 438/721; 438/594
[58] Field of Search .................................. 430/313, 316, 430/318, 330, 329; 216/55, 72; 438/714, 592, 721

[56] References Cited

U.S. PATENT DOCUMENTS

| 5,441,914 | 8/1995 | Taft et al. ................................ 437/189 |
| 5,487,811 | 1/1996 | Iizuka .................................... 156/656.1 |
| 5,545,289 | 8/1996 | Chen et al. ........................... 156/643.1 |
| 5,599,742 | 2/1997 | Kadomura .............................. 437/194 |
| 5,723,893 | 3/1998 | Yu et al. ................................. 257/413 |
| 5,846,695 | 12/1998 | Iwata et al. ............................ 430/331 |

FOREIGN PATENT DOCUMENTS

| 4-105321 | 4/1992 | Japan . |
| 4-219929 | 8/1992 | Japan . |
| 6-275625 | 9/1994 | Japan . |
| 6-318573 | 11/1994 | Japan . |
| 7-202189 | 8/1995 | Japan . |
| 10-144691 | 5/1998 | Japan . |

Primary Examiner—Sharon Gibson
Assistant Examiner—Jill N. Holloman
Attorney, Agent, or Firm—Armstrong, Westerman, Hattori, McLeland & Naughton

[57] ABSTRACT

In a method of manufacturing a semiconductor device, a first film essentially consisting of silicon is deposited on the surface of a semiconductor substrate. A second film essentially consisting of material having a proper etching selection ratio relative to tungsten is deposited on the first film. A third film essentially consisting of tungsten is deposited on the second film. A resist pattern is formed on the third film. The third film is etched and patterned to the surface of the second film, by using the resist pattern as a mask. The second film is etched to have the same shape as the third film. The first film is etched to have the same shape as the third film. After the step of patterning the third film and before the step of patterning the first film, the resist pattern is heated to a temperature of 80° C. or higher, the semiconductor substrate is exposed in atmospheric air, and the resist pattern is removed.

15 Claims, 6 Drawing Sheets

METHOD OF MANUFACTURING SEMICONDUCTOR DEVICE WITH PATTERNED LAMINATION OF SI FILM AND METAL FILM

This application is based on Japanese Patent Application No. Hei 9-216765 filed on Aug. 11, 1997, the entire contents of which are incorporated herein by reference.

BACKGROUND OF THE INVENTION a) Field of the Invention

The present invention relates to a method of manufacturing a semiconductor device, and more particularly to a method of manufacturing a semiconductor device including a process of patterning a lamination of a silicon film and a metal film formed thereon.

b) Description of the Related Art

Low resistance of gate electrodes is becoming the requisite for the recent high performance of MOS transistors. Low resistance techniques, especially using a lamination of a silicon film and a metal film as a gate electrode, have drawn much attention.

Technique of patterning a laminated structure of tungsten (W) and TiN is disclosed in JP-A-4-219929. With this technique, the upper W layer is first etched with F containing gas by using as an etching mask a resist pattern formed on the W layer. Thereafter, the lower TiN layer is etched with $Cl_2$ or Br containing gas. After the TiN layer is etched, the resist pattern is removed to form a patterned lamination structure of W and TiN films. With this technique, a gate electrode structure of a lamination of W/TiN/Si can be formed.

When a lamination structure of gate electrode layers is etched to leave the gate electrode structure, the gate insulating layer is exposed on both sides of the gate electrode structure. In order not to damage a silicon layer under the gate insulating layer, it is desired to automatically stop etching when the gate insulating layer is exposed. To this end, it is necessary to set a high etching selection ratio of the lamination structure of gate electrode layers to the gate insulating layer. The etching conditions disclosed in JP-A-4-219929, however, use an insufficient etching selection ratio, and the silicon layer under the gate insulating layer is likely to be damaged.

SUMMARY OF THE INVENTION

It is an object of the present invention to provide a method of manufacturing a semiconductor device capable of reducing damages of an underlying surface layer when a lamination pattern of a silicon film and a metal film is patterned.

According to one aspect of the present invention, there is provided a method of manufacturing a semiconductor device comprising the steps of: depositing a first film essentially consisting of silicon on the surface of a semiconductor substrate; depositing on the first film a second film essentially consisting of material having a proper etching selection ratio relative to tungsten; depositing on the second film a third film essentially consisting of tungsten; forming a resist pattern on the third film; etching and patterning the third film to the surface of the second film, by using the resist pattern as a mask; patterning the second film to have the same shape as the third film; and patterning the first film to have the same shape as the third film, and the method further comprising the steps of: after said step of patterning the third film and before said step of patterning the first film, heating the resist pattern to a temperature of 80° C. or higher; exposing the semiconductor substrate in atmospheric air; and removing the resist pattern.

Since the resist pattern is heated to a temperature of 80° C. or higher before the semiconductor substrate is exposed in atmospheric air, residues left after the resist pattern is removed can be easily removed. The resist pattern is already removed when the first film is etched. It is therefore possible to avoid adverse effects of carbon to be emitted from the resist pattern. For example, if there is an $SiO_2$ film formed under the first silicon film and an etching atmosphere contains carbon, the etching selection ratio of the silicon film to the $SiO_2$ film is lowered.

According to another aspect of the present invention, there is provided a method of manufacturing a semiconductor device comprising the steps of: depositing a first film essentially consisting of silicon on the surface of a semiconductor substrate; depositing on the first film a second film essentially consisting of material having a proper etching selection ratio relative to tungsten; depositing on the second film a third film essentially consisting of tungsten; forming a resist pattern on the third film; etching and patterning the third film to the surface of the second film, by using the resist pattern as a mask; patterning the second film to have the same shape as the third film; and patterning the first film to have the same shape as the third film, and the method further comprising the step of: after said step of patterning the third film and before said step of patterning the first film, removing the resist pattern without exposing the semiconductor substrate into atmospheric air.

Since the semiconductor substrate is not exposed in atmospheric air before the resist pattern is removed, the resist pattern can be removed cleanly without leaving residues.

DETAILED DESCRIPTION OF THE PREFERRED EMBODIMENTS

According to the method described in the above-cited JP-A-4-219929, a W film and a TiN film are etched by using a resist pattern as a mask. With this method, however, an etching selection ratio of the gate electrode to the gate insulating film of $SiO_2$ is lowered by carbon atoms contained in the resist pattern. In order to maintain the etching selection ratio high, it is desired to remove the resist pattern at least before the gate insulating film is exposed.

Preliminary experiments performed basing upon the above concept will be first described prior to the description of preferred embodiments of the invention.

Figure 6A:
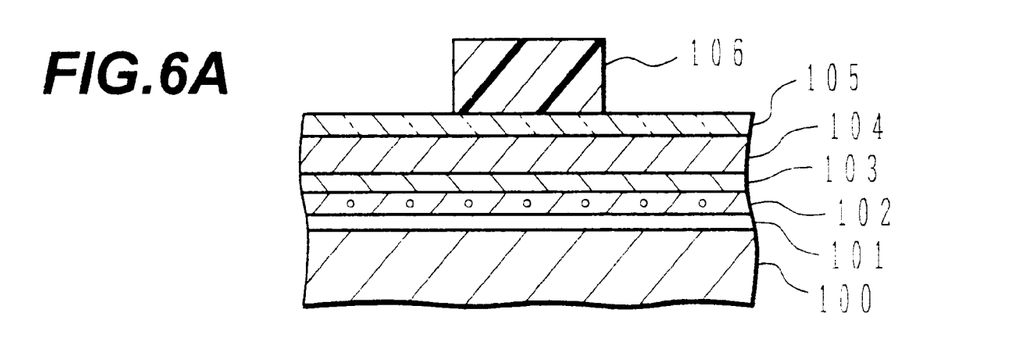
FIGS. 6A and 6B are cross sectional views illustrating the states of a substrate after some processes of preliminary experiments.

As shown in FIG. 6A, a substrate structure was prepared which had a lamination of an $SiO_2$ film 101, a polysilicon film 102, a TiN film 103, a W film 104 and an SiON film 105 stacked in this order from the bottom on a silicon substrate 100. A resist pattern 106 was formed on the $SiO_2$ film 105 which was used as a reflection preventing film during photolithography.

By using the resist pattern 106 as a mask, the SiON film 105 and W film 104 were etched with $NF_3$ gas. In this case, the TiN film functions as an etching stopper. Thereafter, the substrate was exposed in atmospheric air and loaded into a process chamber of a down-flow type resist ashing system using microwave plasma. The resist pattern 106 was removed by using plasma of $O_2$ and $H_2O$.

Figure 6B:
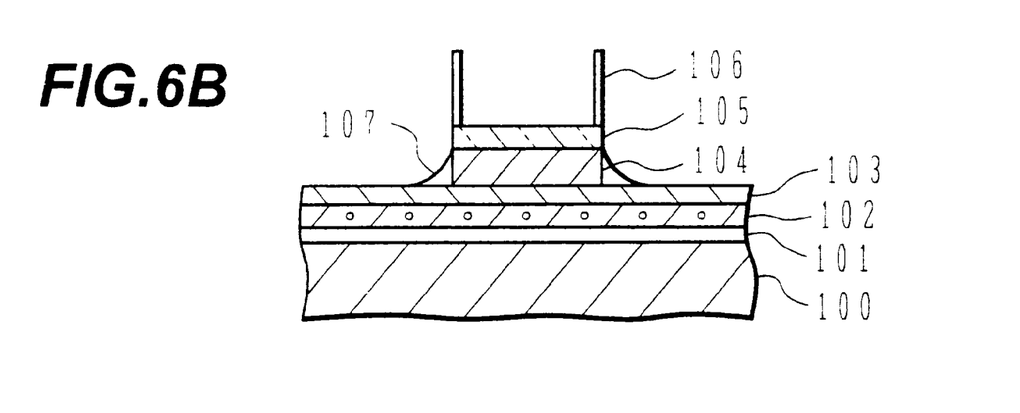

FIG. 6B is a cross sectional view of the substrate after the resist pattern 106 was removed. As shown, residues 106 and 107 were left. The residue 106 had a wall shape protruding upward along the side walls of the lamination structure of patterned SiON film 105 and W film 104, and the residue 107 was formed at the lower portion of the side walls of the patterned lamination structure. Although the residue 106 was removed by amine containing solution (ACT935 manufactured by Advanced Chemical for Advanced Technology), the residue 107 was unable to be removed.

Since the residue 107 is left, the TiN film 103 and polysilicon film 102 cannot be patterned with good controllability by using the W film 104 and SiON film 105 as a mask. The embodiments of the invention can prevent the formation of these residues or can remove these residues so that the TiN film 103 and polysilicon film 102 can be etched with good controllability.

The first embodiment of the invention will be described with reference to FIGS. 1A to 1D.

Figure 1A:
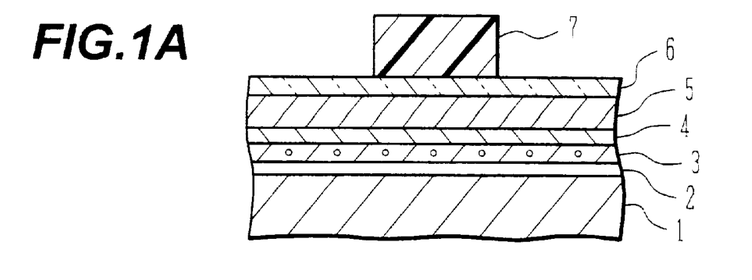
FIGS. 1A to 1D are cross sectional views illustrating the main processes of a semiconductor device manufacture method according to a first embodiment of the invention.

As shown in FIG. 1A, the surface layer of a silicon substrate 1 is thermally oxidized at a temperature of about 900° C. to form a silicon oxide gate insulating film 2 of about 10 nm thick. On the gate insulating film 2, a polysilicon film 3 of about 50 nm thick is deposited by chemical vapor deposition (CVD) using $SiH_4$ as source gas. On the polysilicon film 3, a TiN film 4 of about 25 nm thick is deposited through reactive sputtering using a Ti target and $N_2$ gas and Ar gas. On the TiN film 4, a W film 5 of about 150 nm thick is deposited by CVD using $WF_6$ as source gas. On the W film 5, an SiON film 6 of about 90 nm thick is deposited by CVD using $SiH_4$, $O_2$ and $N_2$ as source gas. In place of the polysilicon film 3, an amorphous silicon film may be deposited.

On the SiON film 6, a resist pattern 7 is formed. By using this resist pattern 7 as a mask, the SiON film 6 and W film 5 are etched.

Figure 4:
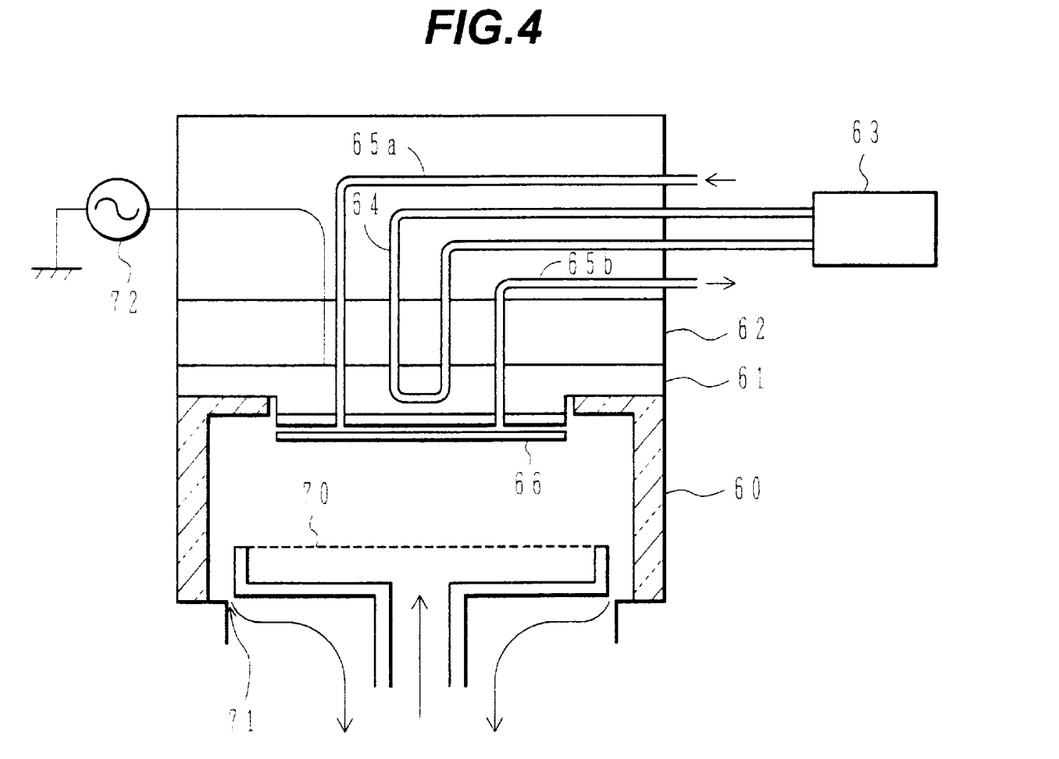
FIG. 4 is a diagram showing the outline of an etching system used by the embodiments.

The outline of an etching system is shown in FIG. 4. A process vessel 60 with upper and lower openings has an electrode 61 hermetically mounted over the upper opening. The electrode 61 is applied with a radio frequency (RF) voltage from an RF power source 72 operating at a frequency of 13.56 MHz. An electrostatic chuck is provided in the electrode 61 to hold a substrate 66 at the bottom surface of the electrode 61.

A coolant flow passage 64 is also formed in the electrode 61. A low temperature chiller 63 introduces coolant into the coolant flow passage 64 to cool the substrate 66 held by the electrostatic chuck. A gas supply pipe 65a and a gas exhaust pipe 65b are open at the chuck surface holding the substrate 66. He gas is supplied from the gas supply pipe 65a. The He gas is filled in a space between the substrate holding surface and the substrate 66 and discharged via the gas exhaust pipe 65b. The He gas filled in the space between the substrate holding surface and the substrate 66 operates as a heat conducting medium to efficiently cool the substrate 66.

At the center of the lower opening of the process chamber 60, an etching gas supply port 70 is mounted. Etching gas is supplied from the etching gas supply port 70 into the process chamber 60. The etching gas supplied into the process chamber 60 is discharged via a gap formed between the inner circumference of the lower opening and the etching gas supply port 70.

Returning back to FIG. 1A, the etching conditions of the SiON film 6 and W film 5 will be described. First, $NF_3$ gas at a flow rate of 140 sccm and Ar gas at a flow rate of 70 sccm are used as the etching gas to perform an etching process for 15 seconds at an inner pressure of the process chamber of 0.1 Torr, an applied power of 500 W and a chiller temperature of −50° C. The W film 5 is etched preferably at a substrate temperature of −20° C. or lower. Next, $SF_6$ gas at a flow rate of 75 sccm and $N_2$ gas at a flow rate of 3 sccm are used as the etching gas to perform an etching process at an inner pressure of the process chamber of 0.08 Torr, an applied power of 230 W and a chiller temperature of −50° C. As the etching gas of the W film 5, gas which contains fluorine such as $NF_3$ gas, mixed gas of $NF_3$ and Ar, $SF_6$ gas, or mixed gas of $SF_6$ and $N_2$ may be used.

The etching completion timing of the W film 5 is detected by monitoring emission spectra of the plasma in the process chamber. The etching completion timing of the W film 5 is presumably when the intensity of the emission peak caused by F atoms increases sharply. After the intensity of the emission peak caused by F atoms increases sharply, over-etch is further performed. The time of this over-etch is about 10% of the time duration from the introduction of $SF_6$ gas to the detection of the etching completion of the W film 5. Since the TiN film 4 serves as an etching stopper, the W film 5 can be removed with good reproductivity.

Figure 1B:
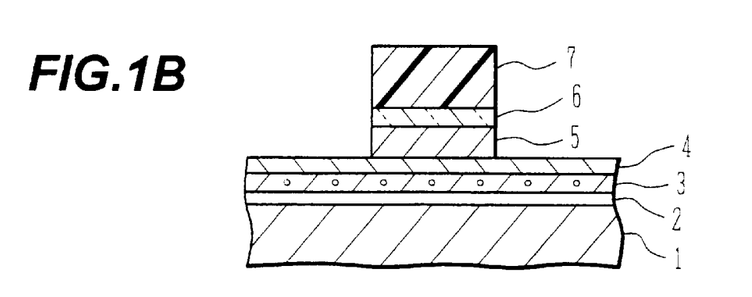

FIG. 1B is a cross sectional view of the substrate after the W film 5 is etched. This substrate is maintained in the etching system and the process chamber 60 is evacuated to perform a heat treatment for one minute at a temperature of 80° C. After this heat treatment, the substrate is picked up from the process chamber into atmospheric air and then placed in a down-flow type resist ashing system using microwave plasma and operating at a frequency of 2.45 GHz to remove the resist pattern 7.

Figure 5:
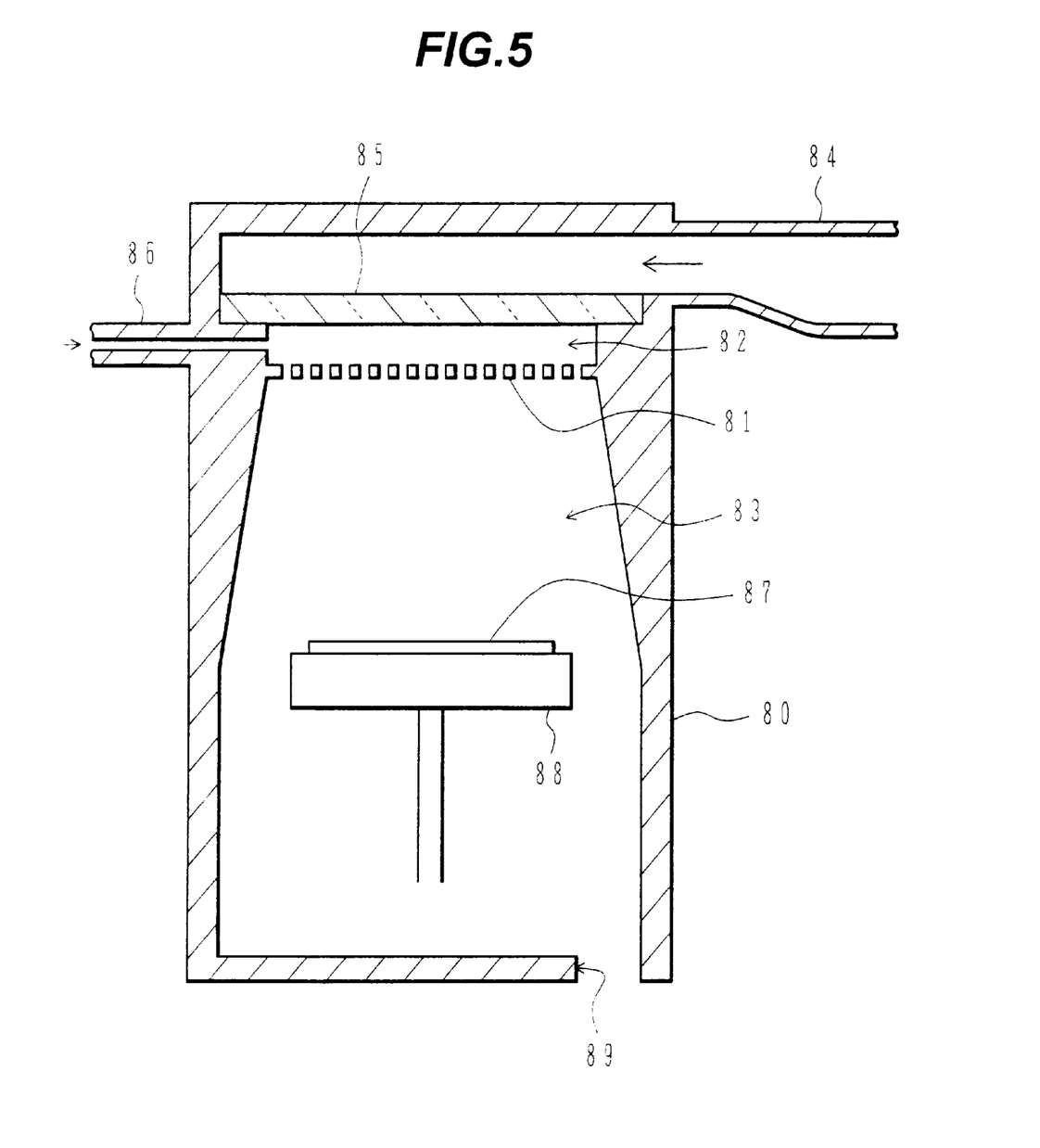
FIG. 5 is a diagram showing the outline of a resist ashing system used by the embodiments.

FIG. 5 shows the outline of the resist ashing system used by the embodiment. The inner space of a process chamber 80 made of Al is divided into an upper plasma generating chamber 82 and a lower process chamber 83 by a meshed shower head 81. Microwaves transmitted via a waveguide 84 pass through a microwave transmitting window 85 and are introduced into the plasma generating chamber 82. Process gas is also introduced via a gas guide tube 86 into the plasma generating chamber 82. A stage 88 for placing a substrate 87 thereon is mounted in the lower process chamber 83.

The process gas supplied into the plasma generating chamber 82 is changed into a plasma state by the microwaves. This plasma flows downward via the shower head 81 and reaches the surface of the substrate 87 placed on the stage 88. This plasma ashes and removes the resist pattern formed on the surface of the substrate 87. The plasma and its byproducts in the lower process chamber 83 are discharged from a lower gas outlet 89.

Returning back to FIG. 1B, the ashing conditions of the resist pattern 7 will be described. $O_2$ gas at a flow rate of 1350 sccm and H$_2$O gas at a flow rate of 150 sccm were used as the ashing gas. The inner pressure of the process chamber was 1.0 Torr, the microwave power was 1.4 kW, and the substrate temperature was 200° C. Under these conditions, the resist pattern 7 was ashed. The residue 107 at the lower side wall portion such as shown in FIG. 6B was not found. The wall residue 106 protruding upward along the side wall portion was able to be removed by processing it with amine containing solution (ACT935 manufactured by Advanced Chemical for Advanced Technology) for 15 minutes at a temperature of 75° C.

As ashing gas, gas which contains F atoms, such as CF$_4$, SF$_6$ or NF$_3$ may also be used.

After the resist pattern 7 is removed, the TiN film 4 and polysilicon film 3 are etched in the etching system shown in FIG. 4, by using the patterned SiON film 6 as a mask.

The TiN film 4 is etched by using Cl$_2$ as etching gas under the conditions of a gas flow rate of 50 sccm, a pressure of 0.05 Torr, an applied power of 500 W, the electrode 61 temperature of 80° C. and an etching time of about 10 seconds. The polysilicon film 3 is etched by using HBr as etching gas under the conditions of a gas flow rate of 100 sccm, a pressure of 0.1 Torr, an applied power of 300 W and the electrode 61 temperature of 80° C.

Figure 1C:
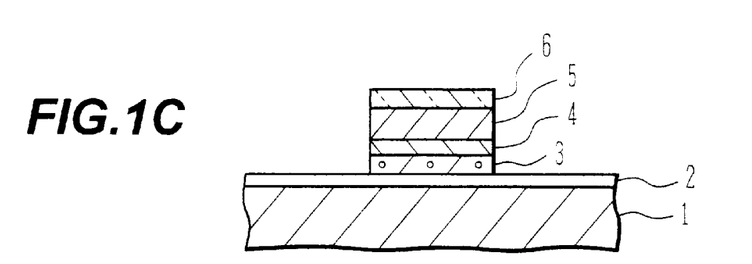

FIG. 1C is a cross sectional view showing the substrate after the TiN film 4 and polysilicon film 3 are etched. As shown in FIG. 1C, a gate lamination structure inclusive of layers from the polysilicon film 3 to the SiON film 6 with generally vertical side walls can be formed while the surrounding gate insulating film 2 is left unetched. In the above manner, a gate electrode of three layers, the polysilicon film 3, TiN film 4 and W film 5, can be formed.

As etching gas of the polysilicon film 3, Cl$_2$ gas, mixed gas of Cl$_2$ and O$_2$, or mixed gas of HBr and O$_2$ may be used.

Figure 1D:
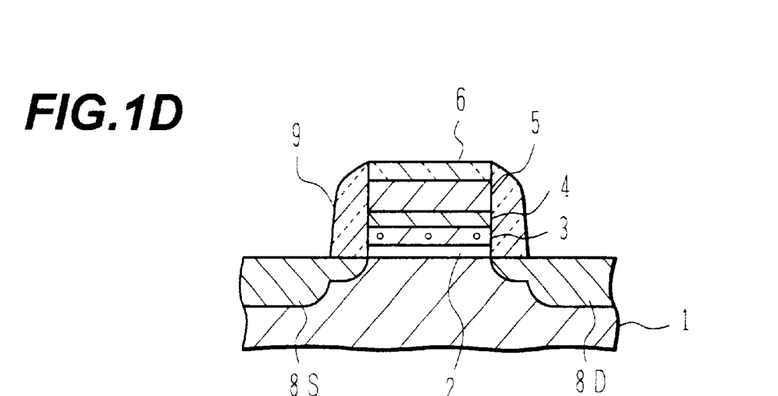

FIG. 1D is a schematic cross sectional view showing a MOS transistor with its source/drain regions being formed after the gate electrode is formed. The processes after the process of FIG. 1C will be briefly described.

Impurity ions are implanted into the surface layer of the silicon substrate by using the gate lamination structure as a mask, to thereby form a low impurity concentration structure in the surface layer. The gate insulating film 2 exposed on both sides of the gate lamination structure is etched and removed. Thereafter, side wall insulating films 9 are formed on the side walls of the gate lamination structure. Impurity ions for the formation of source/drain regions are then implanted by using the sidewall insulating films 9 and gate lamination structure as a mask. The substrate is annealed to activate the implanted impurity ions to form a source region 8S and a drain region 8D in the substrate surface layer on both sides of the gate lamination structure.

In this first embodiment, after the process shown in FIG. 1B, the substrate is subjected to a heat treatment at 80° C. before it is exposed into atmospheric air. This heat treatment can prevent residue which is hard to be removed from being left after the resist pattern 7 is ashed. The residue after the ashing can be removed with amine containing solution.

A heat treatment at a temperature of 50° C. left residue which is hard to be removed. It is therefore preferable to set the heat treatment temperature to 80° C. or higher before the substrate is exposed in atmospheric air. In order to avoid decomposition of resist, it is preferable to set the heat treatment temperature to 200° C. or less. In order to have sufficient heat treatment effects, it is preferable to perform the heat treatment for 30 seconds or longer.

When the polysilicon film 3 is etched at the process shown in FIG. 1C, the lamination of the SiON film 6 and W film 5 is used as an etching mask. In this case, since the resist pattern is not left, adverse effects by carbon atoms can be avoided. Therefore, the polysilicon film 3 can be etched at a high etching selection ratio relative to the gate insulating film 2 made of SiO$_2$.

Next, the second embodiment will be described with reference to FIGS. 2A to 2C.

Figure 2A:
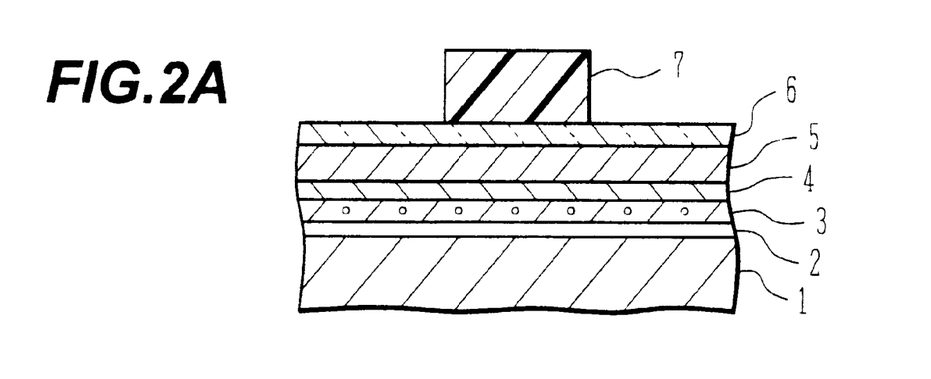
FIGS. 2A to 2C are cross sectional views illustrating the main processes of a semiconductor device manufacture method according to a second embodiment of the invention.

The processes of forming the structure shown in FIG. 2A are the same as those of forming the structure shown in FIG. 1A of the first embodiment. In the first embodiment, the SiON film 6 and W film 5 are etched by using the resist pattern 7 as a mask. In the second embodiment, by using this resist pattern 7 as a mask, the underlying TiN 4 is also etched. The etching conditions of the SiON film 6 and W film 5 are the same as the first embodiment.

After the W film 5 is etched, the substrate is transported into another process chamber while the vacuum state is maintained. The TiN film 4 is etched for about 10 seconds by using Cl$_2$ as etching gas under the condition of a flow rate of 50 sccm, a pressure of 0.05 Torr, an applied power of 500 W and the electrode 61 temperature of 80° C.

In this case, the resist pattern 7 is heated to the temperature of 80° C. Therefore, similar to the first embodiment, the resist pattern 7 undergoes a thermal history prior to the exposure in atmospheric air.

Figure 2B:
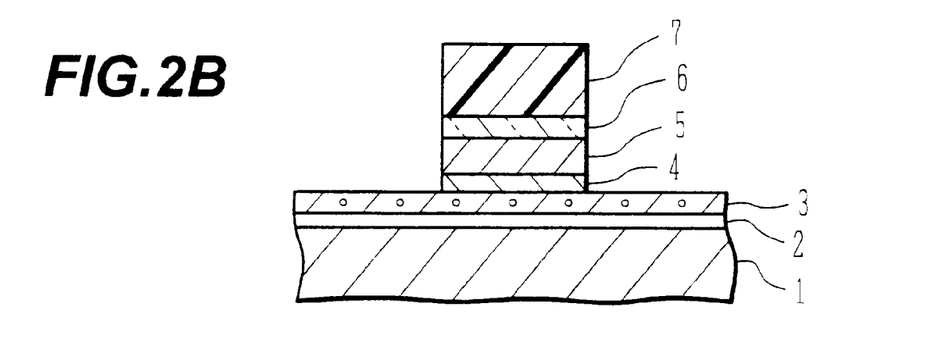

FIG. 2B is a cross sectional view of the substrate after the TiN film 4 is etched. This substrate is once exposed in atmospheric air and placed in the resist ashing system shown in FIG. 5 to remove the resist pattern 7. The ashing conditions are the same as the ashing conditions used for removing the resist pattern shown in FIG. 1B of the first embodiment. Residue after the resist pattern 7 was removed was able to be removed cleanly with amine containing solution.

The polysilicon film 3 is etched by using the SiON film 6 as a mask. The etching conditions of the polysilicon film 3 are the same as the etching conditions used for etching the polysilicon film 3 shown in FIG. 1B of the first embodiment.

Figure 2C:
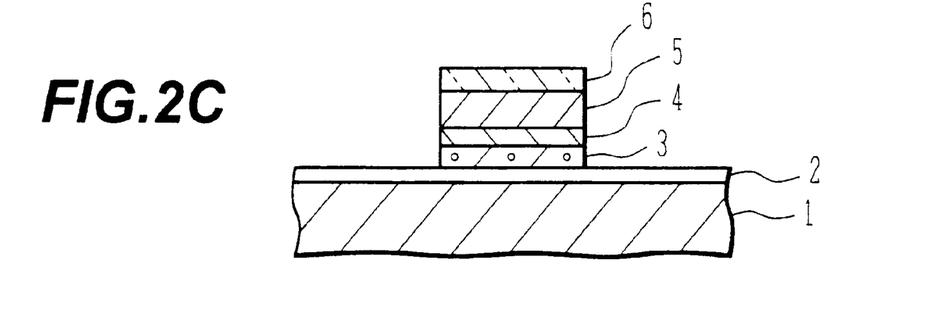

FIG. 2C is a cross sectional view of the substrate after the polysilicon film 3 is removed. Also in this embodiment, since the residue after the resist pattern 7 is removed can be removed easily, the gate lamination structure with upright side walls from the polysilicon film 3 to SiON film 6 can be formed with good reproductivity, similar to the first embodiment. Furthermore, since the resist pattern 7 is not left when the polysilicon film 3 is etched, the polysilicon film 3 can be etched at a high etching selection ratio relative to the gate insulating film 2.

As shown in FIGS. 1A and 2A of the first and second embodiments, the SiON film 6 is formed on the W film 5, and at the later processes shown in FIGS. 1B and 2B the polysilicon film 3 is etched by using the SiON film 6 as a mask. Instead, without depositing the SiON film 6 on the W film 5, the polysilicon film 3 may be etched by using W film 5 as a mask.

The third embodiment of the invention will be described with reference to FIGS. 3A to 3D. In the first and second embodiments, the substrate is once exposed in atmospheric air before the resist pattern is removed. In the third embodiment, the resist pattern is removed without exposing the substrate in atmospheric air.

Figure 3A:
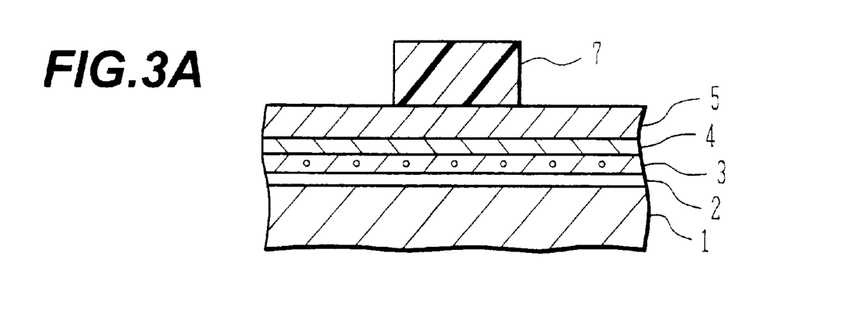
FIGS. 3A to 3D are cross sectional views illustrating the main processes of a semiconductor device manufacture method according to a third embodiment of the invention.

The processes of forming the structure shown in FIG. 3A are generally the same as those of forming the structure shown in FIG. 1A. Only a different point is that the SiON film 6 shown in FIGS. 1A and 2A is not formed. The W film 5 is etched by using a resist pattern 7. The W film 5 is etched by using NF$_3$ and Ar as etching gas under the conditions of an NF$_3$ gas flow rate of 150 sccm, an Ar gas flow rate of 150 sccm, a pressure of 0.1 Torr, an applied power of 200 W and a chiller temperature of −50° C.

Figure 3B:
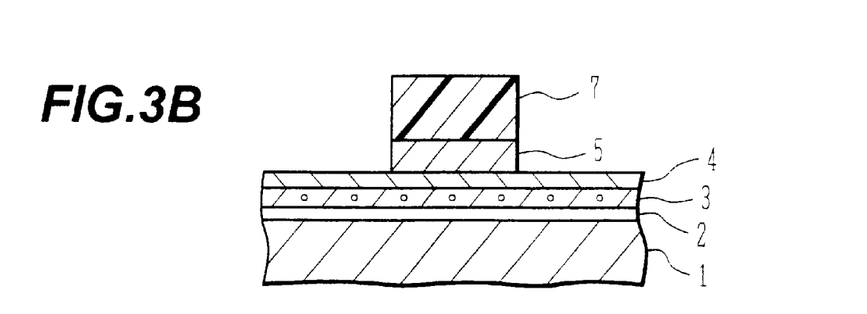

FIG. 3B is a cross sectional view of the substrate after the W film 5 is etched. Without being exposed in athospheric air, the substrate is loaded in the process chamber of the resist ashing system shown in FIG. 5. The resist pattern 7 is removed under the same ashing conditions used for removing the resist pattern 7 shown in FIG. 1B of the first embodiment. It was possible to cleanly remove the resist pattern without leaving residue. The TiN film 4 and polysilicon film 3 are etched by using the W film 5 as a mask.

Figure 3C:
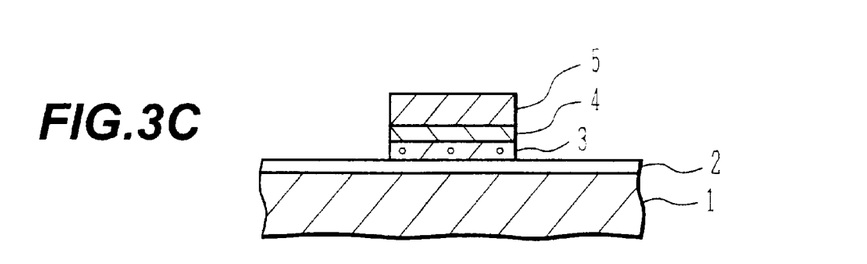

FIG. 3C is a cross sectional view of the substrate after the polysilicon film 3 is etched. Also in this case, the polysilicon film 3 can be etched at a high etching selection ratio relative to the gate insulating film, similar to the first embodiment.

Figure 3D:
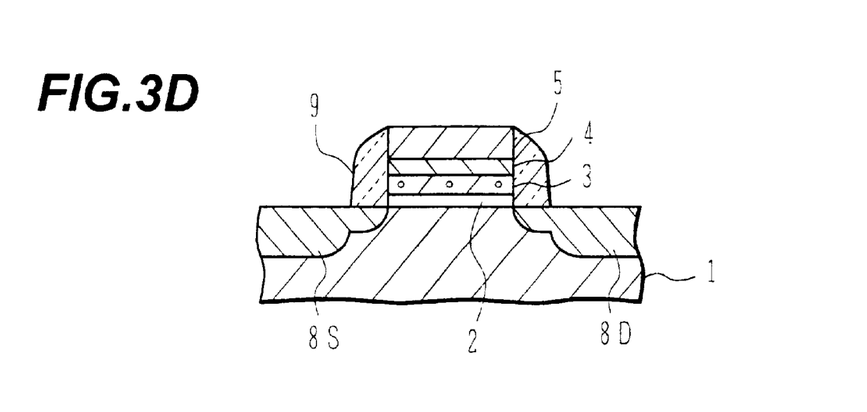

FIG. 3D shows a MOS transistor with the gate lamination structure shown in FIG. 3C. The processes of forming a source region 8S, a drain region 8D and side wall insulating films 9 are similar to those of forming the structure shown in FIG. 1D of the first embodiment.

In the third embodiment, although the TiN film 4 and polysilicon film 3 are etched by using the W film 5 as a mask at the process shown in FIG. 3B, an SiON film 6 such as shown in FIG. 1A of the first embodiment may be deposited on the W film 5 to use this SiON film as an etching mask.

In the first to third embodiments, the TiN film 4 is formed under the W film 5 such as shown in FIG. 1A. Instead of the TiN film 4, other films made of material having a sufficient etching selection ratio relative to W may be used, for example, a two-layer structure film of TiN and Tin may be used.

In the first and second embodiments, the SiON film 6 is deposited on the W film 5 such as shown in FIG. 1A. Instead of the SiON film, other films made of inorganic material which does not contain carbon may be used, for example, an SiN film, an SiO$_2$ film or a lamination film thereof may be used.

In the first to third embodiments, the TiN film 4 and polysilicon film 3 are etched, for example, after the process shown in FIG. 1B in a reactive ion etching (RIE) system. Instead of an RIE system, an electron cyclotron resonance (ECR) plasma etching system may be used. In this case, the etching conditions may be a Cl$_2$ gas flow rate of 30 sccm, an O$_2$ gas flow rate of 5 sccm, a pressure of 5 mTorr, a microwave power of 1200 W, a bias RF power of 30 W and a chiller temperature of 20° C.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device comprising the steps of:
   depositing a first film essentially consisting of silicon on the surface of a semiconductor substrate;
   depositing on the first film a second film essentially consisting of material which serves as an etching stopper when tungsten is etched;
   depositing on the second film a third film essentially consisting of tungsten;
   forming a resist pattern on the third film;
   etching and patterning the third film to the surface of the second film, by using the resist pattern as a mask;
   patterning the second film to have the same shape as the third film; and
   patterning the first film to have the same shape as the third film, and the method further comprising the steps of:
      after said step of patterning the third film and before said step of patterning the first film,
      heating the resist pattern to a temperature of at least 80° C.;
      exposing the semiconductor substrate in atmospheric air; and
      removing the resist pattern.

2. A method of manufacturing a semiconductor device according to claim 1, wherein said step of patterning the second film includes the step of etching the second film at a temperature of at least 80° C., said step of etching the second film at a temperature of at least 80° C. functioning as said step of heating the resist pattern to a temperature of at least 80° C.

3. A method of manufacturing a semiconductor device according to claim 1, further comprising the steps of:
   depositing on the third film a fourth film essentially consisting of inorganic material, after said step of depositing the third film, wherein the resist pattern is formed on the fourth film at said step of forming the resist pattern; and
   etching and patterning the fourth film by using the resist pattern as a mask, before said step of patterning the third film, wherein the first mask is etched by using the fourth film as a mask at said step of patterning the first film.

4. A method of manufacturing a semiconductor device according to claim 1, further comprising the steps of:
   processing the surface of the semiconductor substrate with amine containing solution after said step of removing the resist pattern.

5. A method of manufacturing a semiconductor device according to claim 1, wherein the semiconductor substrate comprises an underlying substrate with a silicon surface layer and a gate insulating film of silicon oxide formed on the surface of the underlying substrate, and the method further comprises the step of forming a source region and a drain region by implanting impurities in the silicon surface layer of the underlying substrate on both sides of the patterned first film, after said steps of patterning the second and first films.

6. A method of manufacturing a semiconductor device according to claim 1, wherein said steps of patterning the second and first films etch the second and first films by using at least one of gases selected from a group consisting of Cl$_2$ gas, mixed gas of Cl$_2$ and O$_2$, HBr gas, and mixed gas of HBr and O$_2$.

7. A method of manufacturing a semiconductor device according to claim 1, wherein the second film is a TiN film or a lamination film of TiN and Ti.

8. A method of manufacturing a semiconductor device according to claim 1, wherein said step of etching the third film etches the third film at a substrate temperature of at most minus 20° C.

9. A method of manufacturing a semiconductor device comprising the steps of:
   depositing a first film essentially consisting of silicon on the surface of a semiconductor substrate;
   depositing on the first film a second film essentially consisting of material which serves as an etching stopper when tungsten is etched;
   depositing on the second film a third film essentially consisting of tungsten;

forming a resist pattern on the third film;

etching and patterning the third film to the surface of the second film, by using the resist pattern as a mask;

patterning the second film to have the same shape as the third film; and patterning the first film to have the same shape as the third film, and the method further comprising the step of:
after said step of patterning the third film and before said step of patterning the first film,
removing the resist pattern without exposing the semiconductor substrate into atmospheric air.

10. A method of manufacturing a semiconductor device according to claim 9, further comprising the steps of:

depositing on the third film a fourth film essentially consisting of inorganic material, after said step of depositing the third film, wherein the resist pattern is formed on the fourth film at said step of forming the resist pattern; and etching and patterning the fourth film by using the resist pattern as a mask, before said step of patterning the third film, wherein the first mask is etched by using the fourth film as a mask at said step of patterning the first film.

11. A method of manufacturing a semiconductor device according to claim 9, further comprising the steps of:

processing the surface of the semiconductor substrate with amine containing solution after said step of removing the resist pattern.

12. A method of manufacturing a semiconductor device according to claim 9, wherein the semiconductor substrate comprises an underlying substrate with a silicon surface layer and a gate insulating film of silicon oxide formed on the surface of the underlying substrate, and the method further comprises the step of forming a source region and a drain region by implanting impurities in the silicon surface layer of the underlying substrate on both sides of the patterned first film, after said steps of patterning the second and first films.

13. A method of manufacturing a semiconductor device according to claim 9, wherein said steps of patterning the second and first films etch the second and first films by using at least one of gases selected from a group consisting of $Cl_2$ gas, mixed gas of $Cl_2$ and $O_2$, HBr gas, and mixed gas of HBr and $O_2$.

14. A method of manufacturing a semiconductor device according to claim 9, wherein the second film is a TiN film or a lamination film of TiN and Ti.

15. A method of manufacturing a semiconductor device according to claim 9, wherein said step of etching the third film etches the third film at a substrate temperature of at most minus 20° C.

* * * * *